United States Patent [19]
Mizushima et al.

[11] Patent Number: 5,545,612
[45] Date of Patent: Aug. 13, 1996

[54] SUPERCONDUCTOR ELEMENT AND METHOD OF MANUFACTURING THE SAME

[75] Inventors: Koichi Mizushima, Kamakura; Jiro Yoshida; Koh-ichi Kubo, both of Yokohama, all of Japan

[73] Assignee: Kabushiki Kaisha Toshiba, Kawasaki, Japan

[21] Appl. No.: 432,054

[22] Filed: May 1, 1995

Related U.S. Application Data

[63] Continuation of Ser. No. 234,626, Apr. 28, 1994, abandoned, which is a continuation of Ser. No. 998,759, Dec. 30, 1992, abandoned, which is a continuation of Ser. No. 263,374, Oct. 27, 1988, abandoned.

[30] Foreign Application Priority Data

Oct. 27, 1987 [JP] Japan ................... 62-271466
May 25, 1988 [JP] Japan ................... 63-127404
Jun. 21, 1988 [JP] Japan ................... 63-152830

[51] Int. Cl.$^6$ .................................. B32B 09/00
[52] U.S. Cl. ............... 505/239; 428/688; 428/930; 428/701; 428/702; 505/193; 505/238; 505/701; 505/702; 257/35
[58] Field of Search .................. 505/190, 191, 505/193, 701, 702, 703, 704, 220, 230, 231, 232, 233, 234, 235, 236, 237, 238, 239; 428/688, 689, 702, 930, 701; 257/35

[56] References Cited

U.S. PATENT DOCUMENTS

| | | | |
|---|---|---|---|
| 4,826,808 | 5/1989 | Yurek | 505/1 |
| 4,931,424 | 6/1990 | Henty | 505/1 |
| 4,952,554 | 8/1990 | Jin et al. | 505/1 |
| 4,980,339 | 12/1990 | Setsune | 505/1 |
| 4,994,433 | 2/1991 | Chiang | 505/1 |
| 5,106,825 | 4/1992 | Mandigo et al. | 505/1 |
| 5,155,094 | 10/1992 | Okabe | 505/1 |

FOREIGN PATENT DOCUMENTS

| | | |
|---|---|---|
| 0301675 | 2/1989 | European Pat. Off. . |
| 0307147 | 3/1989 | European Pat. Off. . |

OTHER PUBLICATIONS

Geballe, "Paths to Higher Temp Super" Science vol. 259, Mar. 12, 1993 pp. 1550–1551.
Doss, "Engineer's Guide to High Temperature Superconductivity," Wiley & Sons, 1989 pp. 152–157, 160–163, 266–269.
Gregory, "The Science & Technology of Superconductivity" vol. 2, Plenum Press 1973 pp. 569–571.
Jap. Abr. 89–156300/21 Nippon T & T, 10–87, oxide superconductor tunnel junction.
CA 109 (26):242036 c, Chang Appl. Phys. Lett. 53(12), 1113–15 1988.
Japanese Journal of Applied Physics, vol. 26, No. 5, part 2, May 1987, pp. L736–L737, Tokyo, JP; T. Kawai et al: "Preparation of High–$T_c$ Y—Ba—Cu—O Superconductor".
Japanese Journal of Applied Physics/ Part 2: Letters, vol. 26, No. 9, Sep. 1987, pp. L1443–L1444, Tokyo, JP; A. Inoue et al: "Y—Ba—Cu—O/Nb Tunnel Type Josephson Junctions".
Applied Physics Letter, vol. 52, No. 4, 25th Jan. 1988, pp. 331–333, American Institute of Physics, New York, NY, US; J. W. Ekin et al: "Method for making low–resistivity contacts to high $T_c$ superconductors".

Primary Examiner—Patrick J. Ryan
Assistant Examiner—Patrick R. Jewik
Attorney, Agent, or Firm—Oblon, Spivak, McClelland, Maier & Neustadt, P.C.

[57] ABSTRACT

A superconductor element includes a first layer of an oxide superconductor, a second layer of an insulator, semiconductor, or metal, and an interlayer interposed between the first and second layers and formed of $AgO_x$ (where in $0<x<\frac{1}{2}$).

4 Claims, 6 Drawing Sheets

SUPERCONDUCTOR ELEMENT AND METHOD OF MANUFACTURING THE SAME

This application is a Continuation of application Ser. No. 08/234,626, filed on Apr. 28, 1994, now abandoned, which is a Continuation of application Ser. No. 07/998,759, filed on Dec. 30, 1992, now abandoned, which is a Continuation of application Ser. No. 07/263,374, filed on Oct. 27, 1988, now abandoned.

BACKGROUND OF THE INVENTION

1. Field of the Invention

The present invention relates to a superconductor element including an oxide ceramic superconductor and a method of manufacturing the same.

2. Description of the Related Art

In recent years, a superconductor formed of an oxide ceramic material as a high-temperature superconductor has received a great deal of attention. Most of to such superconductors are oxide superconductors each having a perovskite structure containing a rare earth element. Such an oxide superconductor is confirmed to exhibit a superconducting property (i.e., a critical temperature is the liquid nitrogen temperature or more) at a high temperature of a liquid nitrogen temperature or more when its composition is properly selected. Along with the advance of fabrication techniques, an oxide superconductor having a higher critical temperature may be obtained. In addition, an oxide superconductor can be easily manufactured as compared with a conventional metal or intermetallic compound superconductor. Therefore, a superconductor element using such an oxide superconductor has been expected.

Most of the superconductor elements represented by a Josephson element include a superconductor/insulator/superconductor junction or superconductor/semiconductor/superconductor junction as its basic structure.

When an oxide superconductor as described above is applied to such a superconductor element, a coherence length of the superconductor is short and element characteristics greatly depend on a condition of the interface between the superconductor and the insulator or the like. In addition, it is difficult to form a good insulating film on an oxide superconductor. In other words, the oxide superconductor has poor junction property with any one of most materials. As an element using an oxide superconductor, samples have been prepared according to a point contact or slit type junction scheme in place of the superconductor/insulator/superconductor junction scheme.

An oxide superconductor also has poor junction property with a semiconductor such as Si or GaAs. Therefore, a sample element having a superconductor/semiconductor/superconductor junction is rarely manufactured.

In addition, an oxide superconductor has poor junction property with a metal. It is difficult to obtain an ohmic electrode having a sufficiently low contact resistance.

In order to achieve a superconductor element having good characteristics by using an oxide superconductor, therefore, an improvement of a poor property of a junction between a superconductor and an insulator, a semiconductor, or a metal is the major issue.

SUMMARY OF THE INVENTION

It is an object of the present invention to provide a superconductor element which can eliminate a poor property of a junction between an oxide superconductor and another material and which has good characteristics, and a method of manufacturing the same.

According to an aspect of the present invention, there is provided a superconductor element comprising a first member of an oxide superconductor, a second member for forming a junction with the first member, and an interlayer of a normal conductor formed between the first and second members. In this case, the interlayer preferably contains silver as a major constituent.

According to another aspect of the present invention, there is provided a method of manufacturing a superconductor element, comprising the steps of forming a silver-containing layer on a first member of an oxide superconductor, heating the first member with the silver-containing layer in an oxygen atmosphere to oxidize said silver-containing layer, thereby forming a interlayer, and forming a second member on the interlayer.

According to the present invention, the first member and the interlayer constitute a junction between the superconductor and the normal conductor. When the superconductor is bonded to the normal conductor, the normal conductor can exhibit a superconducting property within a predetermined region according to a proximity effect. When the thickness of the interlayer is properly determined, the interlayer behaves as a part of the superconductor member. In this case, since the interlayer of the normal conductor having a coherence length longer than that of the oxide superconductor is bonded to the second member, a good junction property can be obtained. Therefore, conventional problems caused by the poor junction property of the oxide superconductor and another material can be solved, and a superconductor element having excellent characteristics can be obtained by using the oxide superconductor.

In addition, when the interlayer formed of a normal conductor containing silver as a major constituent, the element characteristics can be further improved. More specifically, when the oxide superconductor is exposed in air or the like, an oxygen deficient region is generally formed in a region near the surface. When the silver-containing layer is formed on the oxide superconductor, oxygen can be supplied from the silver-containing layer to the oxygen deficient region to obtain a stable superconducting property. Therefore, the element characteristics can be further improved.

A junction is defined as a junction necessary for obtaining good characteristics of a superconductor element and includes a superconductor/insulator junction, a superconductor/semiconductor junction, and a superconductor/metal junction.

DETAILED DESCRIPTION OF THE PREFERRED EMBODIMENTS

Figure 1:
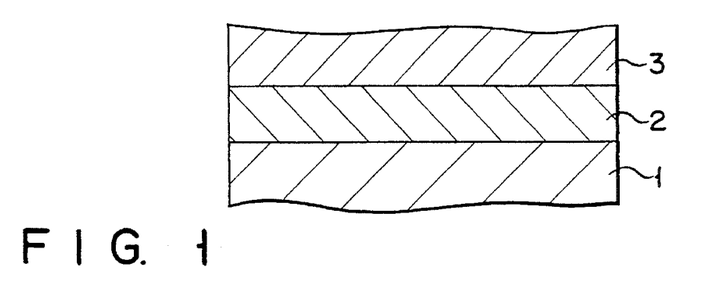
FIG. 1 is a sectional view showing a characteristic portion of a superconductor element according to an embodiment of the present invention.

The present invention will be described in detail with reference to the accompanying drawings. FIG. 1 is a sectional view showing a characteristic portion of a superconductor element according to an embodiment of the present invention. As shown in FIG. 1, the superconductor element of this embodiment has an element structure in which interlayer 2 is sandwiched between first member 1 of an oxide superconductor and second member 3 for forming a junction with first member 1. In a typical superconductor element, first and second members 1 and 3 are films.

The oxide superconductor constituting first member 1 is an oxide superconductor of a defect perovskite type such as $ABa_2Cu_3O_{7-\delta}$ (wherein A represents a rare earth element such as Y, Yb, Ho, by, Eu, Er, Tm, or Lu, and $\delta$ represents oxygen deficiency), a layered perovskite superconductor of an Sr-La-Cu-O type, a Bi oxide superconductor of a Bi-Sr-Ca-Cu-O type, or a Tl oxide superconductor of a Tl-Sr-Cu-O type. However, the oxide superconductor of first member 1 is not limited to such a material. Any oxide superconductor can be used if it exhibits the superconducting property.

Interlayer 2 is made of a normal conductor. If the material and thickness of interlayer 2 are properly selected, interlayer 2 equivalently behaves as a superconductor having a large superconducting gap according to a proximity effect. Therefore, interlayer 2 serves as part of first member 1.

Since interlayer 2 is formed of a normal conductor, it can be selected that the coherence length is larger than that of an oxide superconductor. Therefore, a good junction property between interlayer 2 and second member 3 can be obtained. In other words, characteristics of the superconductor element using an oxide superconductor can be excellent due to the presence of interlayer 2. A superconducting current density of, e.g., a Josephson element can also be improved, and the element characteristics can be further improved.

Figure 2:
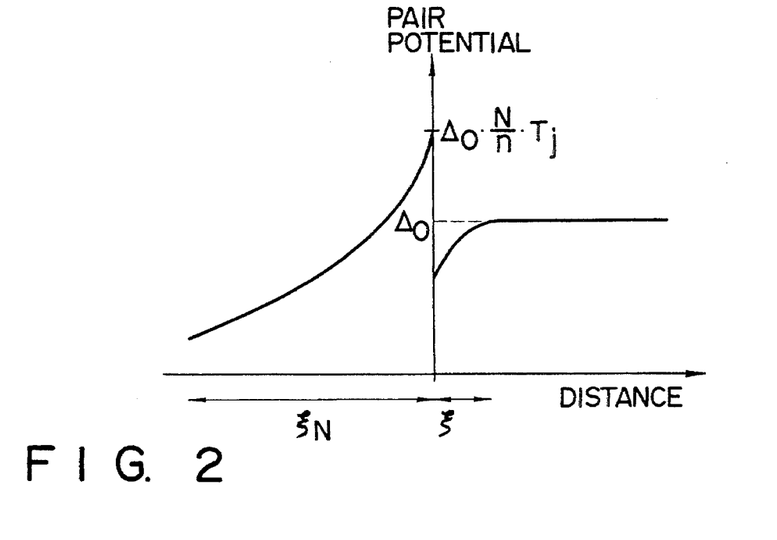
FIG. 2 is an energy diagram of a superconductor/normal conductor junction.

The reason why a normal conductor exhibits a superconducting property due to the proximity effect will be described below. A theoretical principle of a junction between a superconductor and a normal conductor is known as described in an article by P. G. de Gennes (Reviews of Modern Physics, January 1964, PP. 225–237). FIG. 2 shows a superconducting band structure of a junction between the normal conductor and the oxide superconductor having a low carrier concentration. Referring to FIG. 2, $\Delta_0$ represents a superconducting bandgap of the oxide superconductor, $\xi$ represents the coherence length of the oxide superconductor, N represents an electron state density of the normal conductor, n represents an electron state density of the oxide superconductor, $T_j$ represents the transmittance of electrons passing through a junction interface, and $\xi_N$ represents the coherence length of the normal conductor. If electron state density n of the oxide superconductor is lower than electron state density N of the normal conductor by 100 times and transmittance $T_j$ is about 1, superconducting gap $\Delta_0 \cdot N/n \cdot T_j$ of the normal conductor is larger than the superconducting bandgap of the oxide superconductor within the range close to the above theoretical principle, as shown in FIG. 2. Therefore, the normal conductor serves as a superconductor in the region of coherence length $\xi_N$. As a result, the superconducting bandgap of the oxide superconductor can be increased, and hence a larger critical current density can be obtained. In this case, coherence length $\xi_N$ can be defined as follows:

$$\xi_N = hV_F/kT$$

where h is the Planck constant, $V_F$ is the Fermi velocity, k is the Boltzmann's constant, and T is the absolute temperature.

Interlayer 2 preferably contains Ag as a major constituent. More specifically, when a composition of interlayer 2 is represented by $AgO_x$ (wherein x is the number of oxygen atoms per Ag atom), x preferably falls within the range of $0 < x < \frac{1}{2}$. When the x value is small, Ag and oxygen in Ag will make solid-solution. Interlayer 2 may be a uniform $AgO_x$ layer or a two-layered or mixed film of Ag and $Ag_2O$.

When interlayer 2 contains Ag as a major constituent, oxygen is supplied from the Ag-containing layer to first member 1 of an oxide superconductor during the manufacture of the element. An oxygen deficient state near the surface to be bonded to member 1 can be prevented. As a result, first member 1 has excellent superconducting properties, and element characteristics can be further improved.

Interlayer 2 may be formed a normal conductor oxide such as $ReO_3$, $M_xWO_3$, or ITO (indium-tin oxide) in place of $AgO_x$. Of these normal conductor oxides, $ReO_3$ has a lattice constant similar to that of an oxide superconductor having a composition of $YBa_2Cu_3O_{7-\delta}$. Therefore, when a superconductor having this composition is used to form first member 1, the junction between first member 1 and interlayer 2 is excellent. In addition, $ReO_3$ has the highest electrical conductivity among the oxides, and Ag is easily interstitiated into the lattice. Therefore, when an electrode is formed on the oxide superconductor, $ReO_3$ is inserted between the Ag electrode and the superconductor, so that the junction property of the superconductor/$ReO_3$/Ag electrode structure can be excellent.

Figure 3:
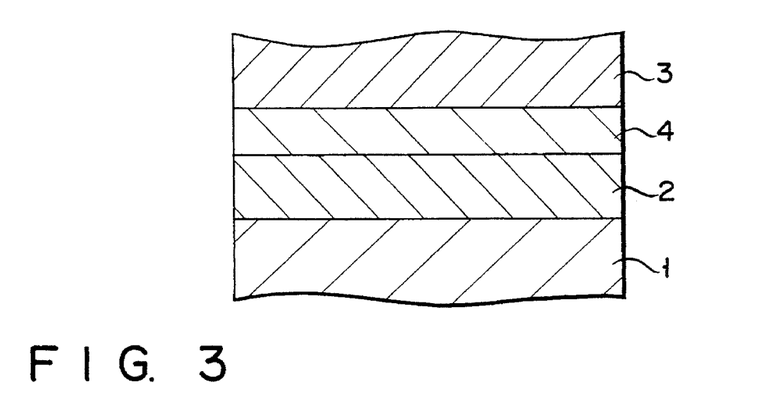
FIG. 3 is a sectional view of a characteristic portion of a superconductor element according to another embodiment of the present invention.

When interlayer 2 contains Ag as a major constituent, Au or Pt buffer layer 4 is preferably formed between interlayer 2 and second member 3, as shown in FIG. 3. Buffer layer 4 effectively functions as a good buffer for preventing diffusion of Ag easily subjected to migration. In particular, in an element such as a superconductor transistor having a junction between a superconductor and a semiconductor, buffer layer 4 is formed between interlayer 2 and second member 3 formed of a semiconductor. Buffer layer 4 serves as a barrier for preventing Cu, Ba, and the like containing first member 1 as well as Ag from being diffused in semiconductor member 3, thereby obtaining an excellent junction property.

Second member 3 may be an insulator, a semiconductor, or a metal, and the material of second member 3 can be arbitrarily selected in accordance with a function of a superconductor element. A typical example of an element having member 3 of an insulator is a Josephson element. A typical example of an element having member 3 of a semiconductor is a superconductor transistor. A typical example of an element having member 3 of a metal is a structure in which an electrode is formed on a superconductor.

A method of manufacturing a superconductor element according to the present invention will be described with reference to FIGS. 1 and 3. First member 1 of an oxide superconductor is formed on a substrate (not shown) by sputtering or the like in the form of a layer. Interlayer 2 of normal conductor is formed on member 1 by deposition or the like. When interlayer 2 contains Ag as a major constituent, an Ag film is formed on member 1 and member 1 is annealed in an oxygen atmosphere at, preferably, 300° to 350° C. to form interlayer 2. By this annealing, oxygen is contained in Ag of interlayer 2. In this case, the content and distribution of oxygen in interlayer 2 are changed due to annealing conditions. For example, the entire layer consists of $Ag_2O$, only a surface portion of the layer consists of $Ag_2O$, or the layer may be a two-layered structure of $Ag_2O$ and Ag or a mixture of $Ag_2O$ and Ag. Oxygen is supplied to the oxygen deficient region of member 1, resultant interlayer 2 does not often contain oxygen. Au or Pt buffer layer 4 can be formed on interlayer 2 as needed.

Second member 3 of an insulator, semiconductor, or metal in the form of a layer is formed on interlayer 2 or buffer layer 4 by deposition or the like. Thus, a superconductor element including an oxide superconductor and having excellent characteristics can be manufactured.

In an element requiring an insulating film on a superconductor as in a Josephson element, after insulating film 2 is formed on member 1 and a metal film such as an Al film is formed on insulating film 2, the metal film is oxidized to obtain an excellent insulating film. When interlayer 2 contains Ag as a major constituent, an Ag film is formed on member 1 and a metal film such as an Al film is formed on the Ag film. Thereafter, the films are oxidized to simultaneously form interlayer 2 and member 3 serving as an insulating film. In this case, an excellent insulating film can be obtained while the property of oxide superconductor member 1 is kept excellent.

Figure 4:
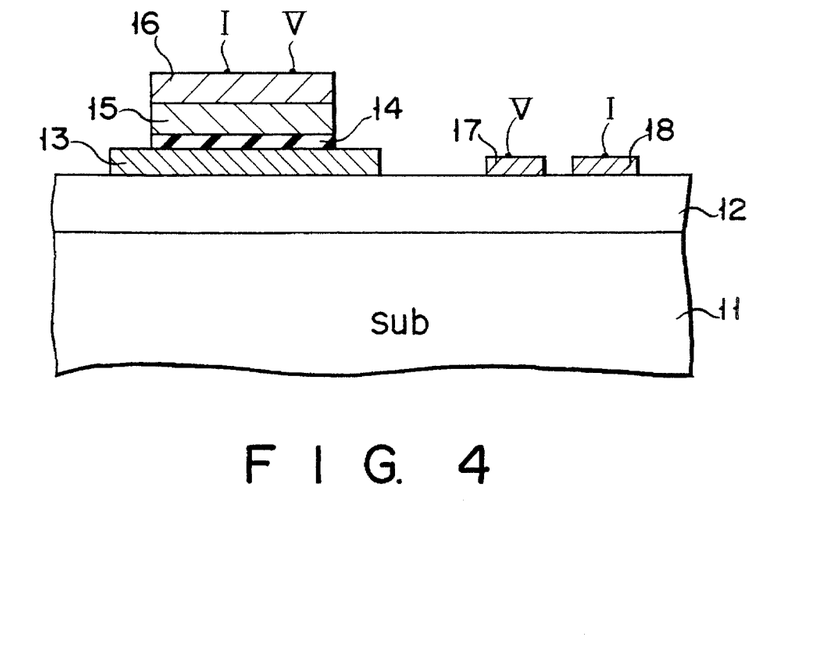
FIG. 4 is a sectional view of a Josephson element which employs the present invention.

A practical elements will be described below. FIG. 4 shows a first example of a Josephson element according to the present invention. Reference numeral 11 in FIG. 4 denotes a substrate, and oxide superconductor film 12 is formed on substrate 11. Oxide superconductor film 12 can be formed of a material selected from the various materials mentioned above. The material of substrate 11 is not limited to a specific one and is properly determined in accordance with the material of oxide superconductor film 12. Normal conductor film 13 is formed on part of oxide superconductor film 12, and insulating film 14 is formed on film 13. Films 12, 13, and 14 constitute a characteristic part of the present invention, as previously mentioned.

Superconductor film 15 is formed on insulating film 14. Superconductor film 15 can be made of any material (e.g., Pb) exhibiting a superconducting property. Electrode 16 serving as current and voltage terminals is formed on superconductor film 15.

Electrode 17 serving as a voltage terminal and electrode 18 serving as a current terminal are formed on the surface of oxide superconductor film 12 adjacent to film 13.

An example of a method of manufacturing the above element will be described below. $SrTiO_3$ substrate 11 was prepared and 1-μm thick oxide superconductor film 12 having a composition of $YBa_2Cu_3O_{7-\delta}$ (critical temperature Tc=75 K) was formed on substrate 11 according to multi-element sputtering. An Ag film having a diameter of 0.5 mm and two Au films serving as electrodes 17 and 18 and each having a diameter of 0.3 mm were formed on film 12 by mask deposition. Each film had a thickness of about 3,000 Å. Thereafter, the resultant structure was annealed in an oxygen atmosphere at 350° C. for 10 hours to partially oxidize the Ag film, thereby forming normal conductor film 13 as a mixture of Ag and $Ag_2O$. A 3,000-Å thick Pb film was deposited on film 13. In this case, Pb in a region of an interface with film 13 was oxidized to form insulating film 14, and the remaining Pb portion was formed as a Pb film as superconductor film 15. Finally, Au electrode 16 was deposited on film 15.

Figure 5:
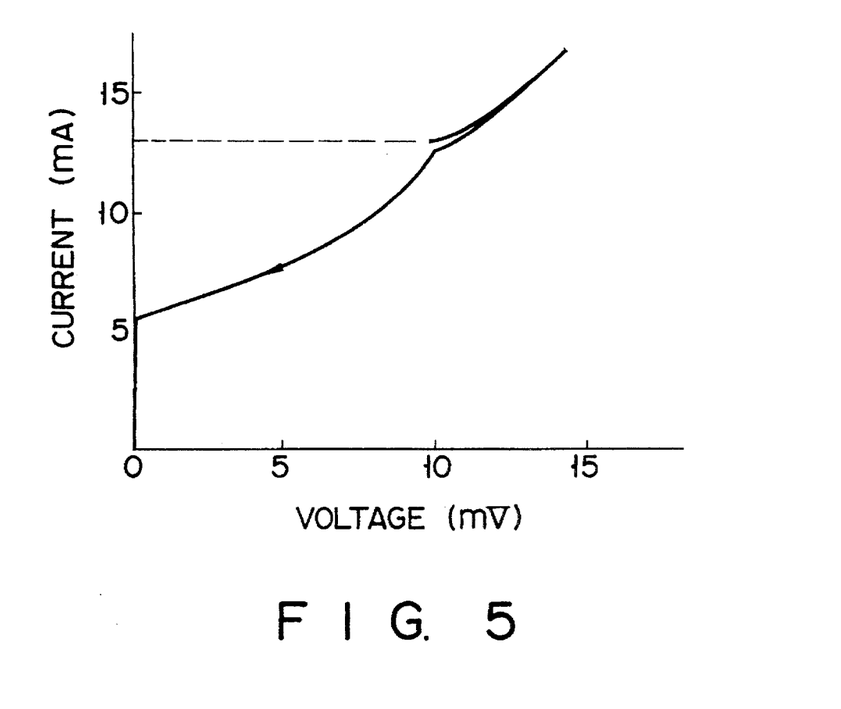
FIG. 5 is a graph showing a current-voltage characteristic curve of the element shown in FIG. 4.

The characteristics of the resultant Josephson element are shown in FIG. 5. As can be apparent from the graph in FIG. 5, a large superconducting gap (2Δ=10 mV) was measured, and it was confirmed that a good Josephson junction was formed. It is understood that film 13 protects oxide superconductor film 12, and film 13 itself is set in a superconducting state by a proximity effect.

Figure 6:
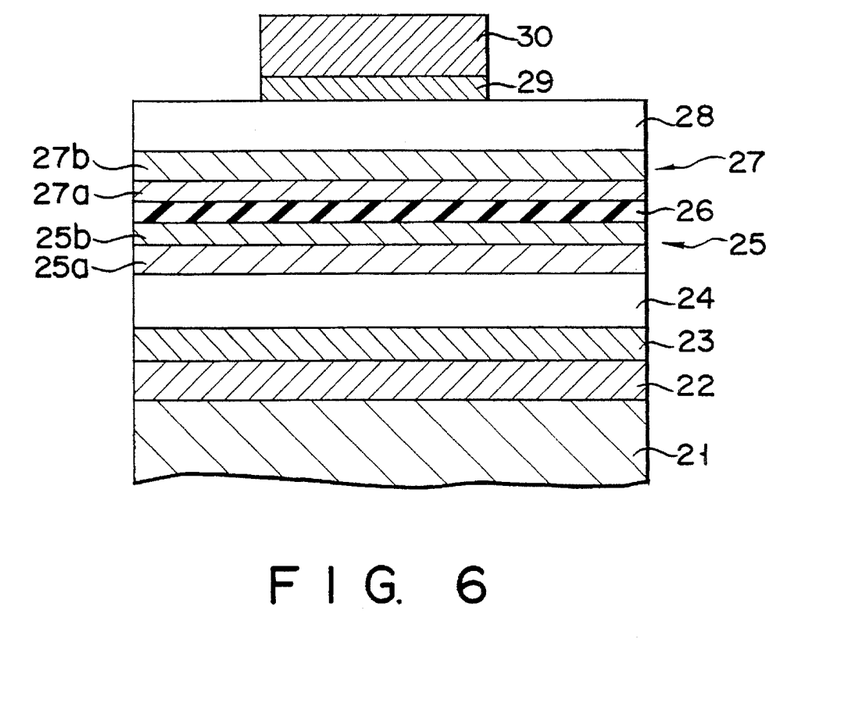
FIG. 6 is a sectional view showing another Josephson element which employs the present invention.

FIG. 6 is a sectional view showing a second example of a Josephson element according to the present invention. Electrode 22, normal conductor film 23, oxide superconductor film 24, normal conductor film 25, insulating film 26, normal conductor film 27, oxide superconductor film 28, normal conductor film 29, and electrode 30 are sequentially formed on substrate 21 made of arbitrary material. In this case, normal conductor film 25 is a two-layered structure of normal conductor oxide film 25a and metal film 25b, and normal conductor film 27 is a two-layered structure of metal film 27a and normal conductor oxide film 27b. Normal conductor films 25 and 27 respectively adjacent to oxide superconductor films 24 and 28 serve as superconductors due to a proximity effect, thereby constituting a Josephson junction.

An example of a method of manufacturing the above element will be described in detail. A 5,000-Å thick $YBa_2Cu_3O_{7-\delta}$ film as oxide superconductor film 24 was formed by sputtering. A material of normal conductor films 22 and 29 was $ReO_3$. These films each having a thickness of 2000 Å were formed by deposition. Two-layered normal conductor film 25 was formed such that $ReO_3$ film 25a having a thickness of 1000 Å was deposited on film 24 and Al film 25b having a thickness of 300 Å was deposited thereon. The surface of Al film 25b was thermally or anodically oxidized to form a 30-Å thick $Al_2O_3$ insulating film 26. Normal conductor film 27 was formed such that Al film 27a similar to film 25b was formed on insulating film 26 and $ReO_3$ film 27b similar to film 25b was formed thereon. $YBa_2Cu_3O_{7-\delta}$ film 28 was formed on film 27b in the same manner as in film 24. Ag was used to form electrodes 22 and 30.

Figure 7:
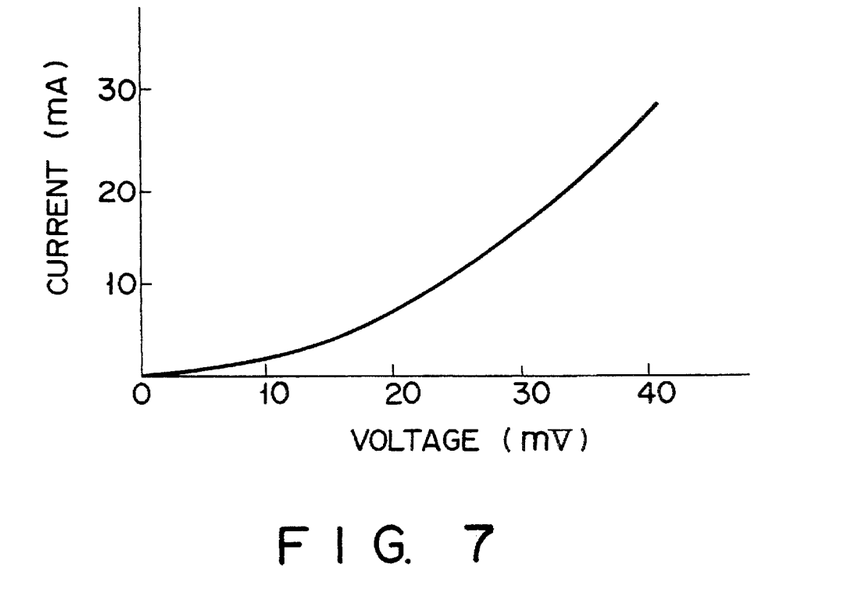
FIG. 7 is a graph showing a current-voltage characteristic curve of the element shown in FIG. 6.

The characteristics of the resultant Josephson element are shown in FIG. 7.

As is apparent from the above example, the oxide film of aluminum which is a normal conductive metal is used as an insulating film constituting the Josephson junction, thereby obtaining an excellent Josephson junction. A superconducting bandgap of the oxide superconductor film can be increased due to the presence of $ReO_3$ and Al films, and a large critical current density can be obtained. In this case, the critical temperature of the oxide superconductor film is high, so that the Josephson element can be operated by a simple refrigerator.

Figure 8:
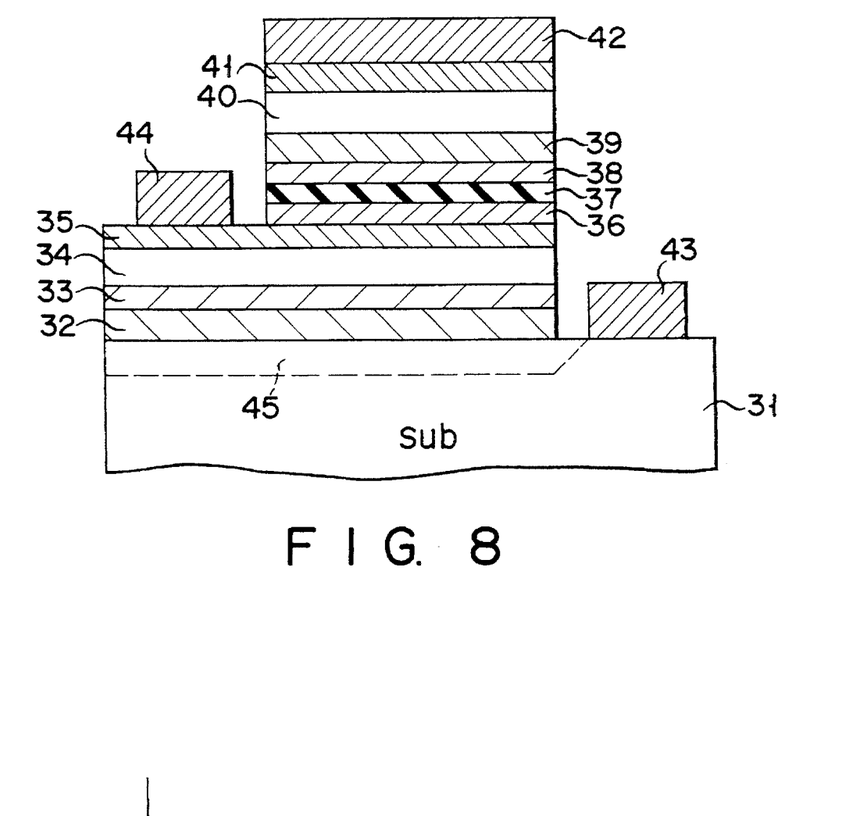
FIG. 8 is a view showing still another Josephson element which employs the present invention.

FIG. 8 is a sectional view showing a third example of the Josephson element according to the present invention. Since the Josephson element in FIG. 6 has two terminals, its application range is undesirably limited. In the example of FIG. 8, there is proposed a 3-terminal Josephson element wherein one of the two oxide superconductor films is controlled by a proximity effect to control the current characteristics of the element. Metal film 32 and normal conductor film 33 are sequentially formed on semiconductor substrate 31, and first oxide superconductor film 34 is formed on film 33. A Schottky barrier is formed between substrate 31 and metal film 32. In a nonbias state, depletion layer 45 is formed in substrate 31, and substrate 31 is electrically insulated from metal film 32. Normal conductor oxide film 35 is formed on film 34, and metal film 36, insulating film 37, metal film 38, normal conductor oxide film 39, oxide superconductor film 40, normal conductor film 41, and electrode 42 are sequentially formed thereon. Films 35 and 36, and films 38 and 39 constitute normal conductor of two-layered structure, respectively. Electrode 43 is formed on substrate 31 to be adjacent to film 32. Electrodes 42 and 44 are main electrodes, and electrode 43 is a control electrode.

In such an element, since films 35, 36, 38, and 39 equivalently behave as superconductors due to a proximity effect, the layers from oxide superconductor film 34 to oxide superconductor film 40 constitute a Josephson junction. When a bias voltage between substrate 31 and oxide superconductor film 34 is changed, a phase transition between superconductor and normal conductor of film 34 can be controlled by a proximity effect between substrate 31 and oxide superconductor film 34. More specifically, when a control voltage applied between control electrode 43 and main electrode 44 is zero, oxide superconductor film 34 is electrically insulated from substrate 31 by depletion layer 45, and a Josephson junction is formed between oxide superconductor films 34 and 40. When a predetermined negative voltage is applied to control electrode 43, the width of depletion layer 45 is decreased, and interaction between oxide superconductor film 34 and substrate 31 is increased. Oxide superconductor film 34 is subjected to phase transition to a normal conductor. As a result, the Josephson junction disappears, and a resistance component appears in the current-voltage characteristics.

An example of the above element will be described in detail below. $YBa_2Cu_3O_{7-\delta}$ was used to form oxide superconductor films 34 and 40, $ReO_3$ was used to form films 33, 35, 39, and 41, silver was used to form film 32, Al was used to form films 36 and 37, $Al_2O_3$ was used to form film 37, and Ag was used to form electrodes 42, 43, and 44. The thicknesses of the respective films were the same as those of the 2-terminal Josephson element, and a 3-terminal Josephson element was manufactured the same procedures as in the 2-terminal Josephson element.

Figure 9:
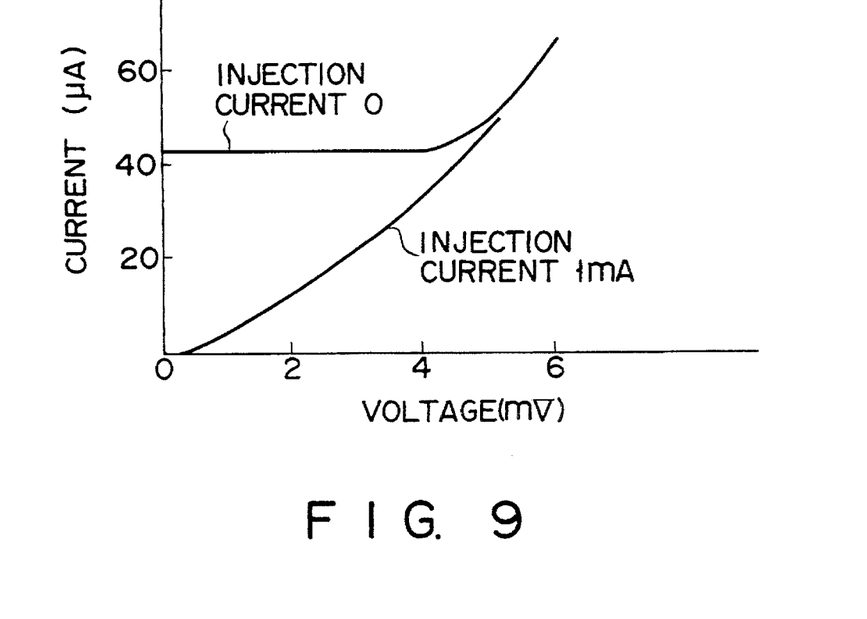
FIG. 9 is a graph showing a current-voltage characteristic curve of the element shown in FIG. 8.

The characteristics of the resultant Josephson element are shown in FIG. 9. A superconducting current flows between electrodes 42 and 44 at a predetermined current or less when an injection current is zero. However, when the injection current is increased to 1 mA, it is confirmed that the current is substantially proportional to the voltage. In other words, a 3-terminal Josephson element can be obtained. In this case, the junction property between the oxide superconductor film, the normal conductor film, and the insulating film can be improved as in the 2-terminal Josephson element of FIG. 6, and a high current density can be obtained. In addition, since the $ReO_3$ film is interposed between the oxide superconductor and the metal electrode, the poor junction property between the oxide superconductor and the metal can be eliminated, and therefore a low contact resistance between the oxide superconductor and the metal can be obtained.

Figure 10:
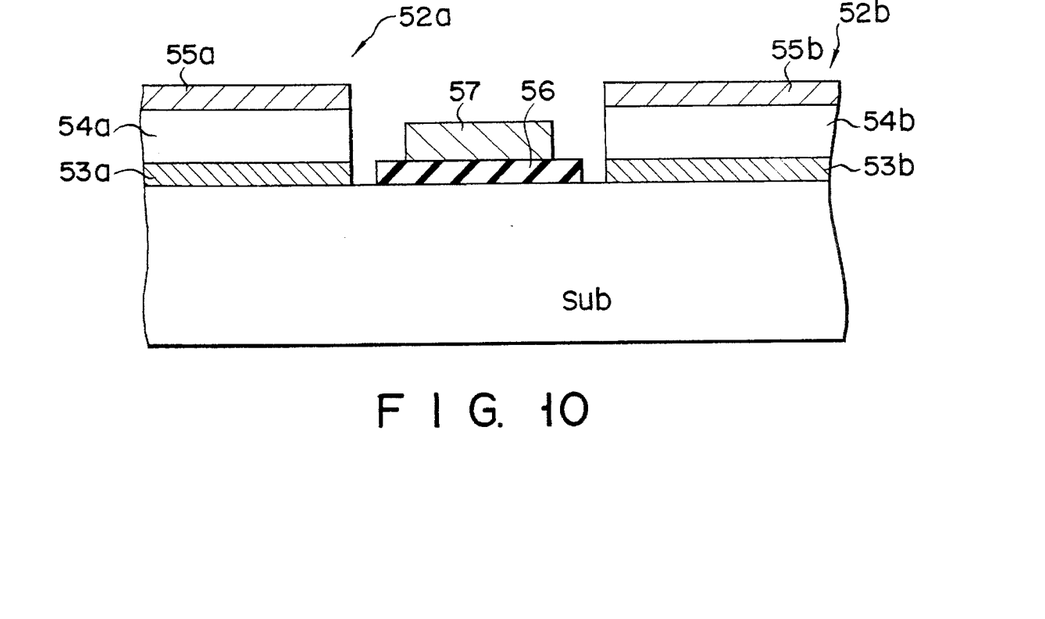
FIG. 10 is a sectional view showing a superconductor transistor which employs the present invention.

FIG. 10 is a sectional view showing an example of a superconductor transistor of the present invention. This transistor has superconductor electrodes as source and drain electrodes. The transistor comprises semiconductor substrate 51, source and drain electrodes 52a and 52b formed on a major surface of substrate 51, gate oxide film 56 formed in a gate region between electrodes 52a and 52b, and gate electrode 57 formed on gate oxide film 56. Electrode 52a is formed such that normal conductor film 53a, oxide superconductor film 54a, and normal conductor film 55a are sequentially stacked. Electrode 52b is formed such that normal conductor film 53b, oxide superconductor film 54b, and normal conductor film 55b are sequentially stacked.

In this element, normal conductor films 53a and 53b formed between semiconductor substrate 51 and oxide superconductor films 54a and 54b are held in a superconducting state due to a proximity effect. Therefore, an ON current can flow substantially without generating heat. A junction property between semiconductor substrate 51 and normal conductor films 53a and 53b can be improved. Therefore, excellent transistor characteristics can be obtained.

When $AgO_x$ is used to form normal conductor films 53a and 53b, an oxygen deficiency of oxide superconductor films 54a and 54b can be compensated by films 53a and 53b, and the superconducting properties of films 54a and 54b can be improved.

In practice, Si was used to form substrate 51, $YBa_2Cu_3O_{7-\delta}$ was used to form oxide superconductor films 54a and 54b, $AgO_x$ was used to form normal conductor films 53a and 53b, Ag was used to form normal conductor films 55a and 55b, $SiO_2$ was used to form gate oxide film 56, and Ag was used to form gate electrode 57 to prepare a superconductor transistor having excellent characteristics.

Figure 11:
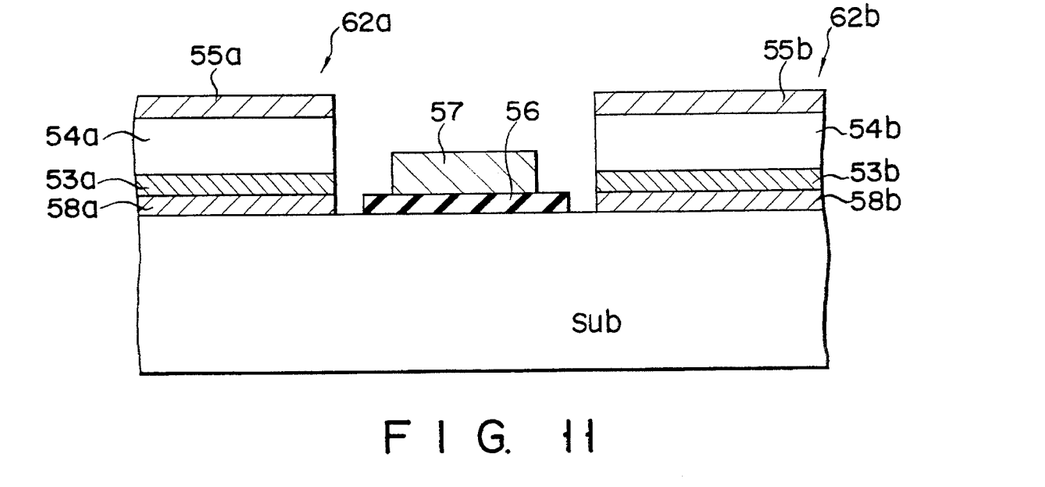
FIG. 11 is a sectional view showing another superconductor transistor which employs the present invention.

FIG. 11 shows a modification of the superconductor transistor shown in FIG. 10. The transistor in FIG. 11 has substantially the same basic structure as that in FIG. 10. $AgO_x$ is used to form normal conductor films 53a and 53b, and Au films 58a and 58b are formed between substrate 51 and films 53a and 53b. More specifically, source and drain electrodes 62a and 62b are formed by adding Au films 58a and 58b to source and drain electrodes 52a and 52b of FIG. 10, respectively.

In this element, Au films 58a and 58b prevent Ag of $AgO_x$ films 53a and 53b from diffusing into substrate 51. When Cu, Ba, and the like are contained in oxide superconductor films 54a and 54b, these metal elements are also prevented from being diffused into substrate 51. Therefore, deterioration of the properties of the substrate and the superconductor films can be prevented. Therefore, highly reliable transistor characteristics can be obtained.

In practice, Si was used to form substrate 51, $YBa_2Cu_3O_{7-\delta}$ was used to form oxide superconductor films 54a and 54b, $AgO_x$ was used to form normal conductor films 53a and 53b, Ag was used to form normal conductor films 55a and 55b, $SiO_2$ was used to form gate oxide film 56, Ag was used to form gate electrode 57, and Au films were formed between substrate 51 and $AgO_x$ films 53a and 53b to prepare a superconductor transistor having excellent transistor characteristics.

Figure 12:
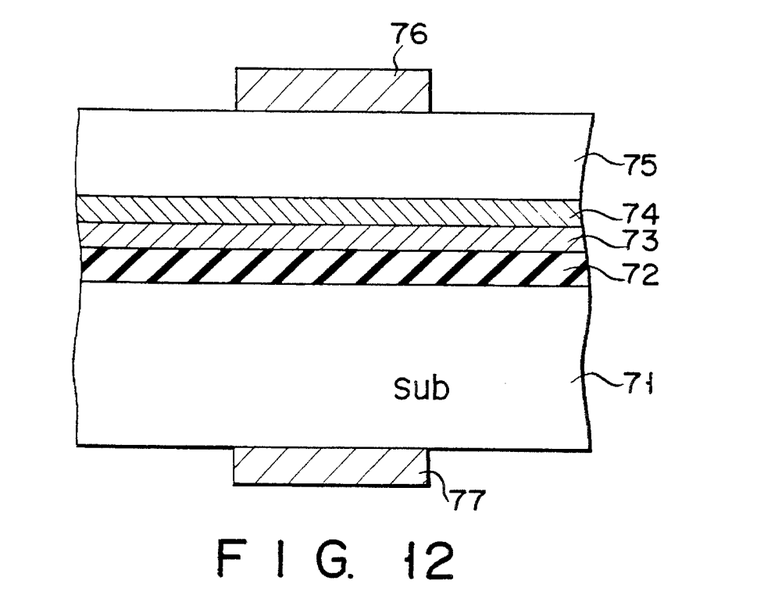
FIG. 12 is a sectional view showing a MOS capacitor to check validity of a buffer layer in the present invention.

A confirmation result of an Au film function as a buffer layer shown in FIG. 11 will be described below. FIG. 12 is a sectional view showing a MOS capacitor formed to confirm the Au film function. As shown in FIG. 12, $SiO_2$ film 72, Au film 73, Ag film 74, and $YBa_2Cu_3O_{7-\delta}$ film 75 were sequentially formed on Si substrate 71. In this case, film 72 had a thickness of 500 Å, each of films 73 and 73 had a thickness of 1,000 Å, and film 75 had a thickness of 1 μm. Electrode 76 was formed on the surface of film 75, and electrode 77 was formed on the surface of substrate 71. Thereafter, the resultant element was annealed in an oxygen atmosphere at 300° to 350° C. for 5 hours to prepare a MOS capacitor.

Figure 13:
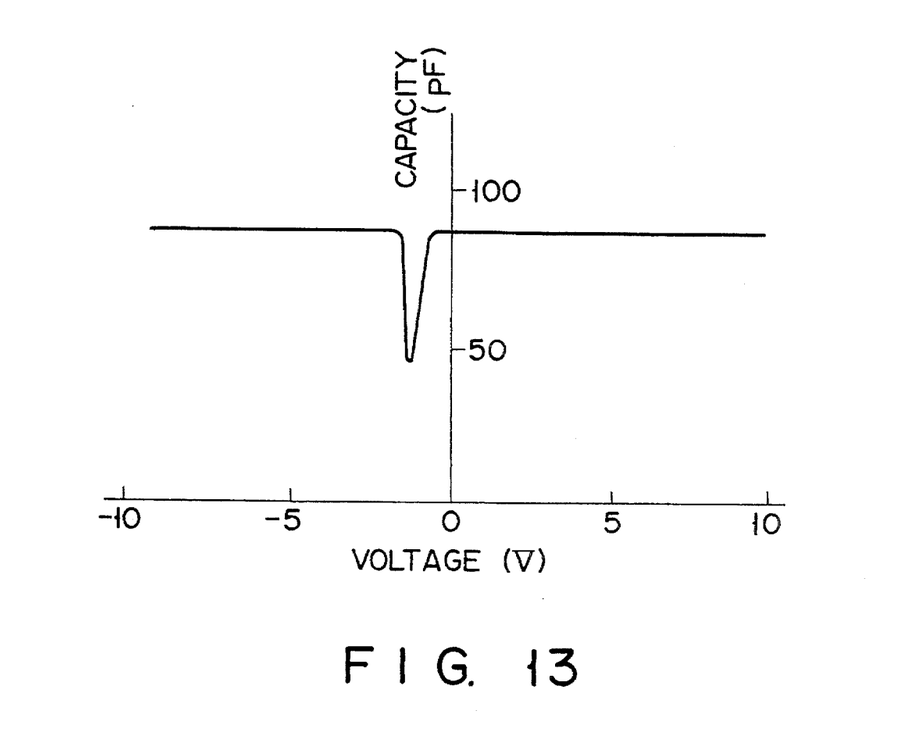
FIG. 13 is a graph showing a C-V characteristic curve of the MOS capacitor shown in FIG. 12.

The C-V characteristics of the resultant MOS capacitor were measured with a 0.1-Hz saw-toothed wave according to a displacement current method, thus obtaining a C-V characteristic curve shown in FIG. 13. These C-V characteristics coincided with the C-V characteristics thereof prior to annealing within a measurement error range. When an Au film was not formed, a large leakage current was detected after annealing, and the corresponding C-V characteristics were found to be deviated from ideal C-V characteristics. It is apparent that the Au film effectively functions as a buffer film.

In the above elements, $YBa_2Cu_3O_{7-\delta}$ is used as the oxide superconductor. However, other oxide superconductors may be used in place of $YBa_2Cu_3O_{7-\delta}$. Furthermore, the present invention is not limited to the exemplified elements but carp be extended to all elements including a superconductor. The present invention is also applicable to a superconductor wiring in addition to an active element.

What is claimed is:

1. A superconducting element structure comprising:

a first member of an oxide superconductor selected from the group consisting of (i) a defect perovskite material of the formula $ABa_2Cu_3O_{7-\delta}$ wherein A represents at least one element selected from the group consisting of Y, Yb, Ho, Dy, Eu, Er, Tm, and Lu, and $\delta$ represents oxygen deficiency, (ii) a layered perovskite superconductor material of the formula Sr-La-Cu-O, (iii) a Bi oxide superconductor material of the formula Bi-Sr-Ca-Cu-O, and (iv) a Tl oxide superconductor material of the formula Tl-Sr-Cu-O;

a second member for forming a junction with said first member; and an interlayer comprising $ReO_3$ interposed between said first and second members and formed of a conductive oxide.

2. A superconducting element structure according to claim 1, wherein said second member is an insulator.

3. A superconducting element structure according to claim 1, wherein said second member is a semiconductor.

4. A superconducting element structure according to claim 1, wherein said second member is a metal.

* * * * *